(12) United States Patent
Plechinger

(10) Patent No.: US 12,078,593 B2
(45) Date of Patent: Sep. 3, 2024

(54) METHOD FOR DETECTING A SPECTRUM, AND SPECTROSCOPY ASSEMBLY

(71) Applicant: ams-OSRAM International GmbH, Regensburg (DE)

(72) Inventor: Gerd Plechinger, Saal a.d.Donau (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 93 days.

(21) Appl. No.: 17/919,713

(22) PCT Filed: Apr. 21, 2021

(86) PCT No.: PCT/EP2021/060445
§ 371 (c)(1),
(2) Date: Oct. 18, 2022

(87) PCT Pub. No.: WO2021/214178
PCT Pub. Date: Oct. 28, 2021

(65) Prior Publication Data
US 2023/0143322 A1    May 11, 2023

(30) Foreign Application Priority Data

Apr. 22, 2020  (DE) .................. 10 2020 205 119.4

(51) Int. Cl.
*G01N 21/359* (2014.01)
*G01J 3/10* (2006.01)
*G01N 21/55* (2014.01)

(52) U.S. Cl.
CPC .............. *G01N 21/359* (2013.01); *G01J 3/10* (2013.01); *G01N 21/55* (2013.01); *G01N 2021/558* (2013.01); *G01N 2201/123* (2013.01)

(58) Field of Classification Search
CPC ................. G01N 21/359; G01N 21/55; G01N 2021/558; G01N 2201/123; G01J 3/10;
(Continued)

(56) References Cited

U.S. PATENT DOCUMENTS 9,983,057 B2 *  5/2018  Kaufmann .............. G01J 3/108
10,885,757 B2 *  1/2021  Duric ..................... H05B 45/10
(Continued)

FOREIGN PATENT DOCUMENTS

DE   102018118079 A1   4/2019
DE   102018213377 A1   2/2020
(Continued)

OTHER PUBLICATIONS

Wang et al., Dye sensitized downconversion, Mar. 9, 2018, J. Phys. Chem. Lett. vol. 9, pp. 1522-1526. (Year: 2018).*
(Continued)

Primary Examiner — Christine S. Kim
(74) Attorney, Agent, or Firm — MH2 Technology Law Group LLP

(57) ABSTRACT

A method for the time-differentiated detection of a spectrum of a test object comprises providing a first conversion dye, which is configured to convert light with a first spectral distribution in the visible range into light with a second spectral distribution in the infrared range. The first conversion dye is excited with a light pulse in the range of the first spectral distribution during a first time period, and a light fraction, reflected or transmitted by the test object, in the range of the first spectral distribution is registered during a first time interval. During a subsequent second time period, a fraction of converted light reflected or transmitted by the test object is registered. According to the invention, the first
(Continued)

time interval is selected so that it lies substantially inside a luminescence lifetime for the first conversion dye in the first time period.

20 Claims, 2 Drawing Sheets

(58) Field of Classification Search
CPC ....... G01J 3/0256; G01J 3/108; H01L 33/504; H01L 33/502
See application file for complete search history.

(56) References Cited

U.S. PATENT DOCUMENTS

| | | | |
|---|---|---|---|
| 11,371,883 B2* | 6/2022 | Koelper | ............ G01J 3/108 |
| 2006/0164004 A1 | 7/2006 | Rossner | |
| 2013/0168720 A1* | 7/2013 | Biebersdorf | ............ H01L 33/56 257/98 |
| 2020/0309348 A1 | 10/2020 | Shitbata et al. | |
| 2021/0293620 A1* | 9/2021 | Husnik | ................ G01J 3/108 |

FOREIGN PATENT DOCUMENTS

| | | |
|---|---|---|
| DE | 112016001966 A1 | 12/2020 |
| EP | 3370309 A1 | 9/2018 |

OTHER PUBLICATIONS

Kang et al., Down-converting luminescent optoelectronics and their applications, Feb. 22, 2023, APL Photonics vol. 8, pp. 020903-1 to 020903-27 (Year: 2023).*

Haan, Martine (EP Authorized Officer), International Search Report (with English Translation) and Written Opinion in corresponding International Application No. PCT/EP2021/060445 mailed on Jul. 13, 2021, 16 pages.

* cited by examiner

METHOD FOR DETECTING A SPECTRUM, AND SPECTROSCOPY ASSEMBLY

CROSS-REFERENCE TO RELATED APPLICATIONS

The present application is a national stage entry from International Application No. PCT/EP2021/060445, filed on Apr. 21, 2021, published as International Publication No. WO 2021/214178 A1 on Oct. 28, 2021, and claims priority to German Patent Application DE102020205119.4 filed Apr. 22, 2020, the disclosures of all of which are hereby incorporated by reference herein in their entireties.

FIELD OF THE INVENTION

The present invention relates to a method for the time-differentiated detection of a spectrum of an object and to a spectroscopy arrangement.

BACKGROUND OF THE INVENTION

One typical application of optoelectronic components and sensors consists in a spectroscopic examination of test objects. In this case, in simple terms, a test object is irradiated with a light of a first wavelength and the light reflected or transmitted by the test object is detected. From the amount of light detected, or else its spectral distribution, the object or parameters thereof may be deduced.

Mobile spectroscopy applications currently available on the market often comprise a light-emitting diode, the infrared spectrum of which is relatively broadband. This light-emitting diode is formed by an optoelectronic component having an associated conversion dye, which converts the visible light, for example blue light, of the optoelectronic component into the infrared spectral range. The light converted in this way is sent onto the sample to be examined, and is reflected or transported thereby. It then impinges on a detector cell and can thus be detected.

In conventional applications, the detector cell comprises a photodetector with a narrowband spectral filter, so that only a narrowly limited wavelength range is registered by the detector. By using the ratio of the signal intensity of the individual detectors, a reflection or transmission spectrum can therefore be generated and evaluated.

However, there are currently only a few phosphor mixtures which can cover the required infrared spectrum in question in the range of 700-1050 nm. Furthermore, the phosphor does not convert all of the light emitted by the electronic components, so that unconverted light is also reflected or transmitted by the test object. In this case, the intensity of the unconverted light in the spectrum may be higher by a factor of several times than the average intensity in the infrared spectral range. Correspondingly, a suitable attenuation filter with high operating currents is needed for the application. The filter fitted over the detector therefore also reduces the optical power in the required spectral range, so that the signal-to-noise ratio is degraded.

An alternative solution for the aforementioned problems consists in using a plurality of different optoelectronic components with a different spectral range, and therefore in emulating the spectrum of a broadband emitter. However, a multiplicity of optoelectronic components are needed for this purpose, so that the space requirement increases correspondingly. Furthermore, a measurement in the visible and infrared ranges requires additional components for generating light in the visible spectral range. The large space requirement therefore makes spectroscopy applications for mobile terminals more difficult.

There is therefore the need to provide a method and a module which are also suitable for mobile terminals and, in particular, make do with a smaller space requirement. This need is accommodated by a method for the time-differentiated detection of a spectrum and by a corresponding spectroscopy arrangement. In this case, it has been recognized that for an impinging light pulse, conversion dyes convert the incident light not directly but with a time offset. This is due to the fact that the excited states of the conversion dye which generate light conversion have a certain lifetime. Because of this lifetime, the charge carriers remain in the excited state and only after some time thus return to the ground state while emitting light in the infrared or converted spectral range. The invention makes use of this situation in the method and in the spectroscopy module.

SUMMARY OF THE INVENTION

A method for the time-differentiated detection of a spectrum of a test object is therefore proposed, wherein a first conversion dye is provided in a first step. The conversion dye is configured to convert light with a first spectral distribution in the visible range into light with a second spectral distribution in the infrared range. This conversion may be carried out at least and particularly by means of fluorescence or at most phosphorescence. In this case, fluorescence refers to a process in which energy supplied from the outside is absorbed in a physical system and leads to an excited state of the physical system. This excited state returns to the ground state while emitting light in the visible or invisible range. For the case in which no additional activation process is necessary between the absorption of the energy and the subsequent emission, the term fluorescence is used. Conversely, the term phosphorescence refers to a process in which an additional activation process, usually in the form of a photon collision or the like, is necessary. In other words, a transition in fluorescence takes place from the excited state to the ground state via a so-called allowed transition. The latter is distinguished by a particularly short lifetime. Conversely, emission of light in phosphorescence takes place through a forbidden transition, which requires an activation process and therefore has a much longer lifetime.

This lifetime is used to the advantage of the proposed method in the selection of the conversion dye. In a second step of the method, the first conversion dye is excited with a light pulse in the range of the first spectral distribution during a first time period. This light pulse of the first spectral distribution may, for example, lie in the visible range. Inside this first time period, a light fraction, reflected or transmitted by the test object, in the range of the first spectral distribution is then registered during a first time interval. The first time interval in this case lies substantially inside at least one lifetime for the first conversion dye.

During a second time period after the first time period, the fraction of the converted light reflected or transmitted by the test object is furthermore measured.

With the proposed method, the reflected or transmitted fraction of light in the range of the first spectral distribution, for example in the visible range, and subsequently a fraction of light in the second spectral range, i.e. of the converted light, for example in the second range, are therefore measured. The registering of the fraction of the light in the range of the first spectral distribution is carried out during the first time interval, since conversion of the light by the conversion dye has not yet taken place inside this time interval. It is given by the minimum lifetime for the first conversion dye. In other words, the first time interval is selected to be so short that it is less than the luminescence lifetime for the first conversion dye.

During the second time period, which in one aspect directly follows the first time period, only the light fraction of the converted light is registered, but no fraction of the light pulse, i.e. of the light in the range of the first spectral distribution. With the proposed method, a different spectral fraction of light is therefore registered and measured by a photodiode with time differentiation. In this way, the photodiode may be configured particularly straightforwardly, i.e. without an elaborate filter. At the same time, the use of space is also reduced since a light-emitting diode with a conversion dye emits both light in the range of the first spectral distribution and light in the range of the second spectral distribution, and the photodetector can register light in both spectral ranges.

As mentioned, the second time period may directly follow the first time period. This is expedient since, after the light pulse is turned off, only converted light is present and this is output by conversion dye with a high intensity. Because of the exponential decrease of the converted light fraction, it is recommendable to place the second time period directly after or shortly after the light pulse is turned off.

In a further aspect, a second conversion dye is provided, which is configured to convert the light with the first or second spectral distribution into light with a third spectral distribution in the infrared range. The second conversion dye is excited with the first light pulse. After the excitation, the light, reflected or transmitted by the test object, of the converted light with the third spectral distribution is registered during a third time period after the second time period. With this aspect, different conversion dyes may therefore be excited by the light pulse. These conversion dyes are distinguished by different minimum lifetimes, so that the light converted by the conversion dyes is emitted at different instants. In this case, in one aspect, it is provided that the luminescence lifetime of the second conversion dye is longer than a sum of the first and second time periods. Emission of converted light by the second conversion dye therefore takes place only after the light pulse and after the conversion of the light pulse by the first conversion dye. In other words, in one aspect a start of the third time period is selected so that it lies after a decay of the luminescence by the first conversion dye. The start of the third time period therefore depends greatly on a relaxation time of the first conversion dye, and is in particular selected so that substantially no luminescence by the first conversion dye is taking place.

In this aspect, a different spectrum of converted light can thus be recorded with a single light pulse and a suitable selection of different conversion dyes and their lifetimes.

In another aspect, a second conversion dye is provided, which converts light with the first spectral distribution or a fourth spectral distribution into light with a third spectral distribution in the infrared range. The second conversion dye is excited with a light pulse in the range of the first or the fourth spectral distribution during a fifth time period. In one aspect, the fifth time period may lie after the third time period. During a second time interval inside the fifth time period, a light fraction, reflected or transmitted by the test object, in the range of the first spectral distribution or respectively the fourth spectral distribution is then registered. Subsequently, during a sixth time period after the fifth time period, the converted light reflected or transmitted by the test object is detected and registered.

By this proposed aspect, at chronologically different instants, light pulses which lead to emission of converted light after the respective luminescence lifetime of the dye are therefore generated for respective conversion dyes. A fraction, reflected or transmitted by the test object, of the unconverted light is registered at the start of the respective light pulse, i.e. before luminescence of the respective conversion dye has yet started. After the end of the respective light pulse, the converted light emitted by the respective conversion dye is then reflected or transmitted by the test object and subsequently measured.

For the proposed method, the first and second conversion dyes are respectively configured so that only a part of the light with the first or fourth spectral distribution is not converted by the dye. In one aspect, light preferably in the visible range is therefore delivered to the conversion dye by the first or second light pulse, respectively. A part of this light passes through the conversion dye and may thus be sent to the test object. After reflection or partial transmission, this light fraction is registered by the detector. In one aspect, light with the first or third spectral distribution in the visible range is converted only to 30-70% and in particular to 45-55%.

In a further aspect, an ambient light fraction is registered during a fourth time period. This fourth time period lies after the second time period, the third or the sixth time period. By registering the ambient light fraction, residual light may therefore be detected and used for the further signal processing. In another aspect, the start of the fourth time period depends on a relaxation time of the first and/or second conversion dye. In particular, this start is selected so that substantially no luminescence is taking place in the first and/or the second conversion dye. The ambient light fraction is therefore determined after the decay of the luminescence by the respective conversion dye, so that only the ambient light but no remaining luminescence is registered.

A further aspect relates to a spectroscopy arrangement in which at least a first optoelectronic component is provided. The latter is configured, during operation, to emit light in a range of a first spectral distribution, particularly in the visible range. A first conversion dye is arranged in the beam path of the optoelectronic component. It is configured to convert light in a first spectral distribution in the visible range into light in a second spectral distribution in the infrared range. The conversion dye therefore generates light in the infrared range from light in the visible range. The spectroscopy arrangement furthermore comprises an optical sensor, which is configured to register light in the first spectral distribution and in the second spectral distribution.

According to the invention, a control circuit is provided, which is coupled to the at least one optoelectronic component and the optical sensor. The control circuit furthermore drives the sensor so that a signal generated by the optical sensor is registered both during a time interval inside the first time period and in a second time period following the first time period. The first time interval is in this case selected so that it lies substantially within a luminescence lifetime of the first conversion dye in the first time period.

The control circuit therefore controls the optoelectronic component and the optical sensor in a time division multiplex method, so that light reflected or transmitted by a test object is registered. This light is on the one hand the light emitted by the at least one optoelectronic component and not converted during the first time interval, and converted light reflected or transmitted by the test object during a subsequent second time period.

In this way, the optical sensor may be configured straightforwardly since light signals with different spectral fractions are registered at different times. The proposed spectroscopy arrangement is therefore capable of broadband examination of a test object, i.e. in a large frequency range of the visible and infrared spectrum.

In a further aspect, the spectroscopy arrangement comprises a second conversion dye, which is arranged in the beam path of the optoelectronic component. It is configured to convert light in the first spectral distribution into light in a third spectral distribution in the infrared range. The control circuit is additionally configured to register a signal generated by the optical sensor during a third time period. The third time period follows the second time period. Furthermore, the second conversion dye exhibits a luminescence lifetime which is longer than a sum of the first and second time periods.

In other words, in this aspect, the reflected or transmitted signal registered by the sensor during the third time period is due only to luminescence of the second conversion dye. This ensures that the signal registered by the sensor during the third time period is caused only by the second conversion dye and not by a persisting luminescence of the first conversion dye.

To this end, in one aspect, it is provided that a start of the third time period depends on a relaxation time of the first conversion dye. The start of the third time period may therefore in particular be selected so that luminescence by the first conversion dye is substantially no longer taking place.

A further aspect relates to a refinement of the proposed spectroscopy arrangement. Therein, a second optoelectronic component is provided, which during operation emits light in a range of a fourth spectral distribution in the visible range. Arranged in the beam path of the second optoelectronic component there is a second conversion dye which converts light from the range of the fourth spectral distribution into light in a third spectral distribution in the infrared range. According to this principle, the control circuit is furthermore configured, during a fifth time period, to drive the second optoelectronic component in order to generate a second light pulse. A signal generated by the optical sensor during a second time interval inside the fifth time period is registered by the control circuit. Furthermore, the sensor likewise generates a signal, which contains a luminescent light fraction of the second conversion dye, during a sixth time period. The sixth time period in this case lies after the fifth time period.

The aforementioned second time interval is in this aspect selected so that it lies substantially inside a luminescence lifetime for the second conversion dye in the fifth time period.

With this proposed principle, a spectroscopy arrangement is realized in which a plurality of optoelectronic components with a conversion dye respectively arranged above them are driven successively. At the same time, the light detected by an optical sensor is registered by a control circuit. The registering is likewise carried out with time matching, so that on the one hand respectively unconverted light fractions of the respective optoelectronic components, and on the other hand the fractions, reflected or transmitted by a test object, of light converted by the respective conversion dye, are detected. In this way, the spectroscopy arrangement is particularly broadband, i.e. it is able to register a spectrum both in the visible and in the infrared range.

In a further aspect, the control circuit is configured to register a signal generated by the optical sensor during a fourth time period. In this case, the fourth time period lies after the second time period, the third time period or sixth time period. In this aspect, the optical sensor is driven by the control circuit so that it receives residual light, or ambient light, and forwards this to the control circuit for further evaluation. By evaluation of the residual or ambient light, the signal-to-noise ratio of the spectroscopy arrangement may be improved.

Expediently, in one aspect, a measurement of the residual light, or ambient light, is carried out at an instant at which luminescence by the first or second conversion dye is substantially no longer taking place. Thus, a start of a measurement for the residual or ambient light depends on a relaxation time of the first and second conversion dyes.

BRIEF DESCRIPTION OF THE DRAWINGS

The invention will be explained in detail below with reference to the figures, in which.

DETAILED DESCRIPTION

Figure 1:
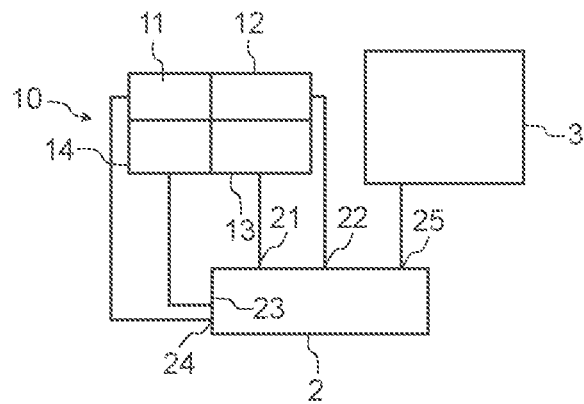
FIG. 1 shows an exemplary embodiment of a spectroscopy arrangement according to the proposed principle.

FIG. 1 shows an embodiment of a spectroscopy arrangement with some aspects of the proposed principle. The spectroscopy arrangement 10 comprises an array having a plurality of optoelectronic components 11, 12, 13 and 14 arranged in a matrix. In this case, 4 optoelectronic components are arranged by way of example in a 2×2 matrix, although there may also be additional or fewer components depending on the application and requirement. Each optoelectronic component is configured, during operation, to output light in a predefined spectral range of the visible light. For example, the optoelectronic component 11 generates blue light, the optoelectronic component 12 generates green light, the component 13 generates the color orange and the component 14 generates red light. By suitable combined driving, besides the individual different colors, it is also possible to produce mixed colors so that the visible spectrum can be covered in a broadband fashion by the arrangement represented here.

Each optoelectronic component furthermore comprises a conversion dye, which is matched to the respective optoelectronic component 11 to 14. It is arranged in the beam path of the respective optoelectronic component. The respective conversion dye is configured to convert the light emitted by the optoelectronic component at least partially into light in the infrared spectrum.

In a similar way as for the electronic components, the conversion dyes are also selected so that they emit their converted light in respectively different ranges of the infrared spectrum. With such an arrangement, it is therefore possible to provide a broadband emitter whose optoelectronic components, together with the conversion dyes, respectively form light-emitting diodes that emit both in the visible and in the infrared range.

The spectroscopy arrangement furthermore comprises an optical sensor in the form of a photodiode 3. The diode is configured to receive the light output by the optoelectronic components 11 to 14 and convert it into a corresponding signal as a function of the intensity received. The photodiode 3 is in this case configured particularly straightforwardly, i.e. without an additional filter. In order to correct a frequency response, i.e. a different sensitivity to the respective spectral fractions, the diode 3 of the spectroscopy arrangement may be calibrated beforehand. It is likewise possible to obtain a flattest possible and uniform frequency response by corresponding measures.

The spectroscopy arrangement 10 furthermore comprises a control circuit 2. The circuit 2 is coupled on the output side to each of the optoelectronic components 11 to 14 for driving. Furthermore, the control circuit is connected to the photodiode 3 via the input 25.

During operation of the proposed spectroscopy arrangement, the control circuit 2 individually drives the corresponding optoelectronic components by respectively corresponding signals from the outputs 21 to 24. The driving is in this case carried out with a time offset, so that in one exemplary embodiment only one of the optoelectronic components is active. During this time period, the optoelectronic component therefore emits light in the visible range. The light which is output is partly absorbed by the conversion dye, which is then put into an excited state. At the same time, a further light fraction is emitted unconverted and impinges on the object to be examined. It is reflected by the latter in the direction of the photodiode 3. According to the light which is detected, the photodiode 3 then generates a signal and returns this to the control circuit. This reflected fraction is also registered and returned after the luminescence of the conversion dye has begun. By suitable chronological selection of the signals output by the photodiode and driving of the photodiodes, the individual fractions, reflected or transmitted by the test object, of the unconverted and converted light can be registered and measured.

Figure 2:
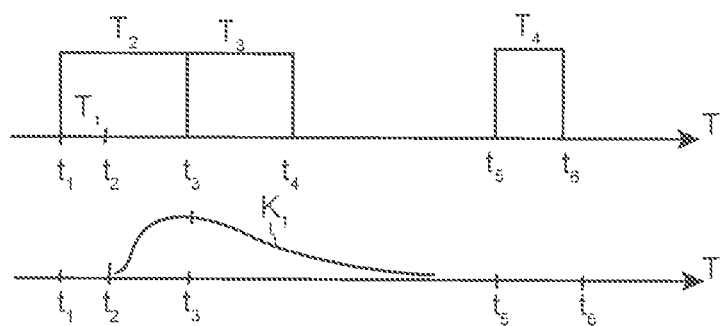
FIG. 2 shows a time diagram with various instants and time periods to explain the proposed principle.

Such an exemplary embodiment is shown in respect of the chronological sequence for the driving of the optoelectronic component and subsequent detection in FIG. 2.

At the instant t1 until the instant t3, the optoelectronic component is activated by the control circuit. In this way, a light pulse is output and guided onto the conversion dye K1 in the beam path of the respective component. The time period between the instants t1 to t3 is denoted as the time period T2. As may be seen in the lower part of FIG. 2, however, luminescence of the conversion dye K1 does not take place simultaneously with the start of the light pulse output by the optoelectronic component, but with a time offset. This is because the light pulse output by the component is at least partially absorbed by the conversion dye K1 and the latter is therefore put into a higher excited state.

The conversion dye remains in this energetically excited state for a time until it returns to the ground state or a lower state by emitting a photon. The time interval is also referred to as the lifetime, and in particular as the luminescence lifetime. In this case, the term luminescence lifetime relates to the time interval in which the excited system remains in the excited state, before it transitions back into the ground state or a lower state while emitting a photon. This lifetime is longer or shorter depending on the transition, i.e. whether it takes place spontaneously or after activation, for example by collision or momentum transfer. Luminescence with a spontaneous transition and a short lifetime is generally referred to as fluorescence. Phosphorescence refers to luminescence with a transition after activation, which generally results in a longer lifetime than in fluorescence.

In the present example, luminescence of the conversion dye K1 therefore begins only shortly after the instant t2. During the time between t1 and t2, no converted light is output since conversion does not yet take place during this time interval. It may also be said that the conversion dye is being pumped, i.e. put into an excited state, during this time interval. After the instant t2, the luminescence of the conversion dye K1 begins, for example with an exponential rise up to a particular maximum. This maximum is reached still during the time period T2, i.e. before the instant t3. In this regard, in this exemplary embodiment an equilibrium state is therefore set up between converted light which is output and absorbed light.

From the instant t3, the light pulse is then turned off. Further light output therefore takes place only by the dye. During the time period T3, the optical sensor therefore detects only a converted light fraction. From the signal profile and a known intensity decrease, the amount of light during the time period T3 may therefore be registered by the control circuit. After a certain time, the luminescence of the conversion dye K1 has decreased to such an extent that the intensity of the luminescence by the conversion dye has become negligible. From the instant t5 to the instant t6, i.e. during the time period 14, only an ambient light fraction is therefore detected by the optical sensor.

With the proposed principle, registering of the different light fractions therefore takes place at respectively different times, without having to provide additional measures such as filters and the like for the photodiode or the optical sensor. During the first time interval T1, only the unconverted light and ambient light are therefore registered by the photodiode. During the time period T3, which follows the light pulse, the photodiode continues to detect the ambient light and a light fraction converted by the conversion dye. During the detection between the instants T5 and T6, only the ambient light is registered, and it may therefore be subtracted from the previous measurement values.

Figure 3:
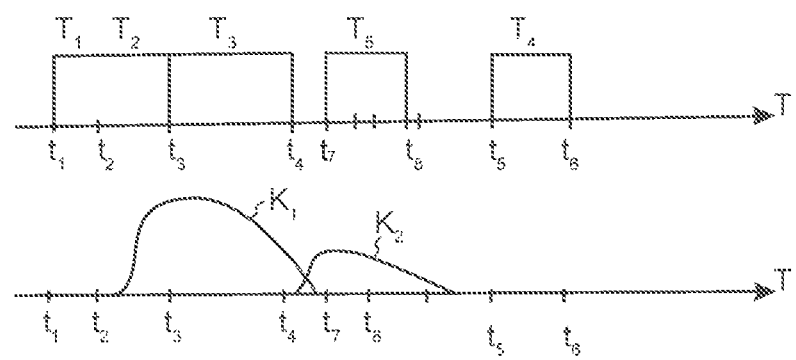
FIG. 3 shows a further representation of various time periods with corresponding luminescence profiles.

FIG. 3 shows a refined embodiment, in which in this case two conversion dyes K1 and K2 with differently long luminescence lifetimes are provided. The two conversion dyes K1 and K2 are excited by the same light pulse.

During the time interval T1 inside the time period T2, only unconverted light and the ambient light are registered by the photodiode. At the instant t2, the control circuit turns the optical sensor off, while the optoelectronic component continues to emit light. Shortly after the instant t2, there is a steep rise in the luminescence of the first conversion dye K1. At the instant t3, this at least one first conversion dye K1 is in equilibrium with the excitation by the optical electronic component. t3 is also the instant at which the optical electronic component is turned off by the control circuit, so that now only the light converted by the first conversion dye and the ambient light impinge on the photodetector.

During the time period T3, the optical sensor then registers an intensity of the converted light of the first conversion dye K1. The luminescence is reduced slightly toward the end of the time period T3 and decreases progressively until the instant t7. At the same time, however, the luminescence of the second conversion dye K2 increases. This is because the second conversion dye K2 has a significantly longer luminescence lifetime than the first conversion dye K1. That is to say, during the time period T2 in which the optoelectronic component is actively turned on, the second conversion dye K2 is also put into an excited state. This excited state has a longer lifetime, so that the dye does not exhibit a sufficiently high luminescence for the measurement until after the instant T7. Correspondingly, during the time period T5, the luminescent light, reflected by a test object, of the second conversion dye K2 is then registered by the optical sensor. The intensity of the second conversion dye K2 also decreases over time, so that the luminescence of the first and second conversion dyes K1, K2 are substantially negligible at the instant t5. Therefore, during the time period T4 between the instants t5 and t6, only the ambient light can be again registered by the optical sensor and subtracted from the previous signals.

By the use of conversion dyes with different luminescence lifetimes, it is thus possible to register a spectrum which is formed from the emission spectrum of an optoelectronic component in combination with the spectra of various conversion dyes.

Figure 4:
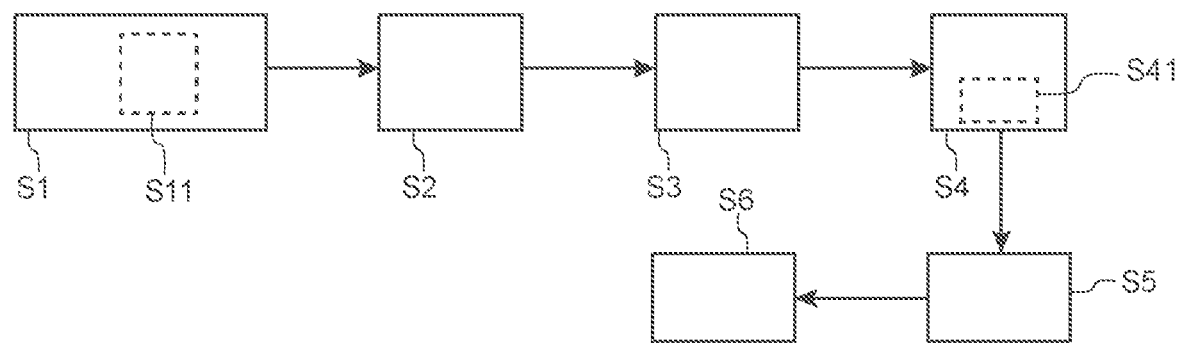
FIG. 4 shows a first exemplary embodiment of a method for the time-differentiated detection of a spectrum of a test object.

FIG. 4 in this regard shows an exemplary embodiment of a method for the time-differentiated detection of a spectrum of a test object according to the proposed principle. In step S1, a first conversion dye is provided, which is capable of converting light with or in a first spectral distribution in the visible range into light of a second spectral distribution in the infrared range. In a subsequent second step, the first conversion dye is then excited with a light pulse in the range of the first spectral distribution. This light pulse takes place during a first time period.

Furthermore, during a first time interval inside this first time period, light, reflected or transmitted by a test object, in the range of the first spectral distribution is registered. This step therefore detects the light, which is reflected or transmitted by the object and impinges on the object without being converted by the conversion dye during the first time interval. In the chronologically following step S4, the fraction of the converted light reflected or transmitted by the test object is then detected. The detection is carried out during a second time period, which follows the first time period. In this case, the second time period may directly follow the first time period, although it is also possible for a small time interval to lie between the start of registering of the fraction of the converted light and the light pulse which is active during the first time period.

The effect achieved by the different chronological detection in the steps S3 and S4 is that firstly only unconverted or converted light, but not a mixture thereof, is registered. In an optional subsequent step S5, during a following period, the residual or ambient light is detected. The light fractions registered and detected in this way are evaluated together in step S6 in order to obtain the spectrum reflected or transmitted by the test object.

Besides the individual method steps proposed here, step S1 additionally comprises the optional step S11. In the latter, a second conversion dye is provided, which is configured to convert light in the first spectral distribution into light with a third spectral distribution in the infrared range. In this case, the second conversion dye is distinguished in particular by a luminescence lifetime which is longer than the luminescence lifetime of the first conversion dye. During step S2, not only the first conversion dye but both conversion dyes are therefore excited by the light pulse. In the optional subsequent step S41, after the detection of the converted light of the first conversion dye, a light fraction which is reflected or transported by the test object and corresponds to the converted light with the third spectral distribution is then also detected.

Figure 5:
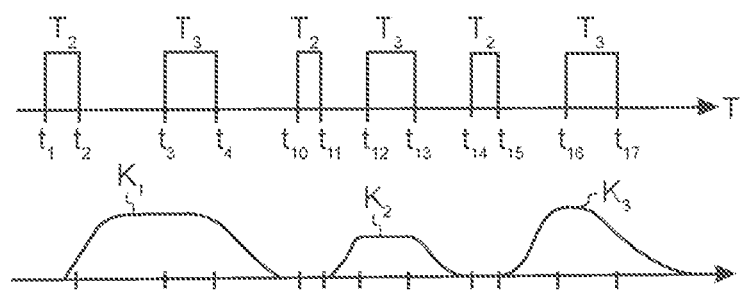
FIG. 5 shows a time diagram with signals for driving the optoelectronic components, or the photodiode, as well as the corresponding time profiles of the conversion dyes.

FIG. 5 shows a further embodiment, in which not only one optoelectronic component but a plurality of optoelectronic components are successively activated and their respective conversion dyes K1, K2, K3 are at least excited. The driving of the individual optoelectronic components as well as the detection of the signals are therefore carried out with a time offset. In the embodiment, during the first time period T2, a first optoelectronic component is turned on and the first conversion dye K1 is therefore excited. In this exemplary embodiment, the luminescence lifetime of the conversion dye K1 is selected so that luminescence does not occur until after the second time period has elapsed. An unabsorbed light fraction may therefore be detected throughout the entire second time period T2. In this way, the first time interval for the detection of the reflected or transmitted signal may be selected to be equal to the second time period.

From the instant t3 to the instant t4, the converted light output by the first conversion dye K1 is then detected. This lies in a known range of the infrared spectrum, which is different to the conversion spectra of the other two conversion dyes K2 and K3. At instant t10, the luminescence light of the first conversion dye K1 has decayed sufficiently so that a further new light pulse is generated in a second optoelectronic component. The light pulse of the second optoelectronic component excites a second conversion dye K2 and "pumps" it in the excited state. Because of the luminescence lifetime of the dye K2, no luminescence light is generated during this time interval. An unabsorbed fraction of the light of the second optoelectronic component is therefore registered during this time period T2. The luminescence of the second conversion dye K2 also takes place in this embodiment after the instant t11, i.e. after the light pulse is turned off during the subsequent time period T3. Between the instants t12 and t13, the fraction of the light converted by the conversion dye K2 is detected. Lastly, after decay of the light of the conversion dye K2, a third optoelectronic component is turned on at the instant t14 and a light pulse is delivered to the third conversion dye K3. The luminescence of the third conversion dye is registered during the time period T3 between the instants t16 and t17.

By this successively sequenced activation of optoelectronic components with subsequent detection of an unconverted and converted light fraction, a spectrum reflected or transmitted by a test object can thus be registered and evaluated in a broadband fashion.

Figure 6:
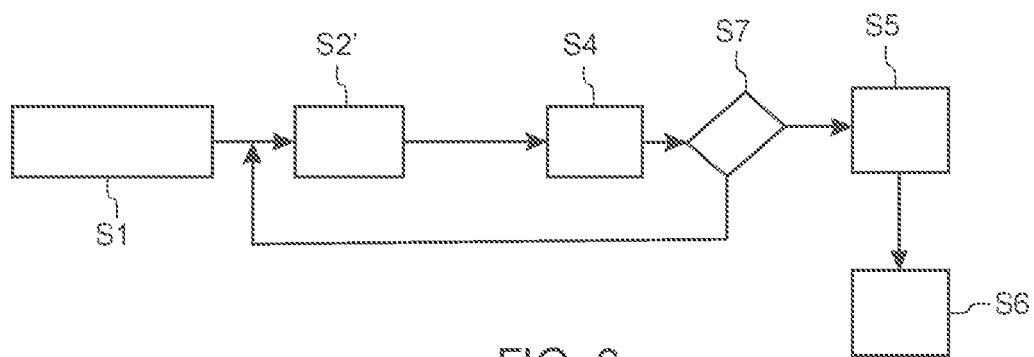
FIG. 6 shows a further exemplary embodiment of the proposed method, which corresponds to the embodiment of FIG. 5.

FIG. 6 shows in this regard the individual steps of such a method. In step S1, the various optoelectronic components and the associated conversion dyes are provided. In the subsequent step S2, activation of a first optoelectronic component and simultaneous registering of the light fraction which is unconverted but reflected or transmitted by the test object is then carried out. After the light pulse, the converted light emitted by the conversion dye, which is reflected or transmitted by the test object, is again registered in step S4. These two steps S2 and S4 are repeated in step S7 until all optoelectronic components have been activated at least once. In this way, a broadband spectrum is recorded in both the visible and infrared ranges.

Subsequently, a further measurement for detecting the ambient light is carried out in step S5. The signal intensity of residual or ambient light determined in this way is compared and evaluated against the results of the preceding steps in step S6.

It is to be understood that the disclosure given herein is not restricted to the particular constituent parts of the devices described or steps of the methods described, since such a device and such a method may vary. It is also to be understood that the terminology used herein only serves the purpose of describing particular embodiments and is not intended to be restrictive. It should be noted that, as used in the description and the appended claims, the definite and indefinite articles are intended to mean that there are one or more of the elements, unless expressly indicated otherwise in the context. For example, the reference to "a unit" or "the unit" may comprise a plurality of devices and the like. Furthermore, the words "comprising", "containing" and similar formulations do not exclude other elements or steps.

The invention claimed is:

1. A method for the time-differentiated detection of a spectrum of a test object, comprising:
    providing a first conversion dye, which is configured to convert light in a first spectral distribution in the visible range into light of a second spectral distribution in the infrared range;
    exciting the first conversion dye with a light pulse in the range of the first spectral distribution during a first time period;
    registering during a first time interval a light fraction, reflected or transmitted by the test object, in the range of the first spectral distribution;
    registering a light fraction of the converted light, reflected or transmitted by the test object, during a second time period after the first time period;
    wherein the first time interval is selected so that the first time interval lies substantially inside a luminescence lifetime for the first conversion dye in the first time period.

2. The method as claimed in claim 1, wherein the first time interval is selected so that substantially no light fraction of the converted light is registered.

3. The method as claimed in claim 1, wherein the second time period directly follows the first time period.

4. The method as claimed in claim 1, furthermore comprising
    providing a second conversion dye, which is configured to convert light in the first spectral distribution into light with a third spectral distribution in the infrared range;
    exciting the second conversion dye with the first light pulse;
    registering a light fraction, reflected or transmitted by the test object, of the converted light with the third spectral distribution during a third time period after the second time period.

5. The method as claimed in claim 4, wherein a luminescence lifetime of the second conversion dye is longer than a sum of the first and second time periods.

6. The method as claimed in claim 4, wherein the third spectral distribution at least does not fully overlap with the second spectral distribution.

7. The method as claimed in claim 4, wherein a start of the third time period depends on a relaxation time of the first conversion dye, and in particular is selected so that luminescence by the first conversion dye is substantially no longer taking place.

8. The method as claimed in claim 1, furthermore comprising
    providing a second conversion dye, which is configured to convert light in the first spectral distribution or in a fourth spectral distribution into light with a third spectral distribution in the infrared range;
    exciting the second conversion dye with a light pulse in the range of the first spectral distribution or of the fourth spectral distribution during a fifth time period;
    registering during a second time interval a light fraction, reflected or transmitted by the test object, in the range of the first spectral distribution or of the fourth spectral distribution;
    registering a light fraction, reflected or transmitted by the test object, of the converted light during a sixth time period after the fifth time period;
    wherein the second time interval is selected so that the second time interval lies substantially inside a luminescence lifetime for the second conversion dye in the fifth time period.

9. The method as claimed in claim 8, wherein the fifth time period lies after the third time period.

10. The method as claimed in claim 1, wherein the first and/or second conversion dye is configured so that a part of the light with the first spectral distribution or the third spectral distribution in the visible range is not converted by the dye.

11. The method as claimed in claim 1, wherein the first conversion dye is configured so that light with the first spectral distribution in the visible range is converted from 30% to 70%, and in particular to 45% to 55%.

12. The method as claimed in claim 1, furthermore comprising
    registering the ambient light fraction during a fourth time period, the fourth time period lying after one of the second time period, third time period and sixth time period.

13. The method as claimed in claim 12, wherein a start of the fourth time period depends on a relaxation time of the first and/or second conversion dye, and in particular is selected so that luminescence in the first and/or second conversion dye is substantially no longer taking place.

14. The method as claimed in claim 1, furthermore comprising:
    evaluating the light fraction registered during the first time interval and during the second time period.

15. A spectroscopy arrangement, comprising:
    at least a first optoelectronic component, which is configured during operation to emit light in a range of a first spectral distribution in the visible range;
    a first conversion dye, which is arranged in the beam path of the optoelectronic component and is configured to convert light in a first spectral distribution in the visible range into light in a second spectral distribution in the infrared range;
    an optical sensor, which is configured to register light in the first spectral distribution and in the second spectral distribution;
    a control circuit, which is coupled to the at least one optoelectronic component and the optical sensor and is configured to drive the at least one optoelectronic component during a first time period and to register a signal generated by the optical sensor both during a first time interval inside the first time period and in a second time period following the first time period, wherein the first time interval is selected so that it lies substantially inside a luminescence lifetime of the first conversion dye in the first time period.

16. The spectroscopy arrangement as claimed in claim 15, furthermore comprising
    a second conversion dye, which is arranged in the beam path of the optoelectronic component and is configured to convert light in the first spectral distribution into light in a third spectral distribution in the infrared range;

wherein the control circuit is configured to register a signal generated by the optical sensor during a third time period following the second time period, a luminescence lifetime of the second conversion dye being longer than a sum of the first and second time periods.

17. The spectroscopy arrangement as claimed in claim 15, wherein a start of the third time period depends on a relaxation time of the first conversion dye, and in particular is selected so that luminescence by the first conversion dye is substantially no longer taking place.

18. The spectroscopy arrangement as claimed in claim 15, furthermore comprising:
- a second optoelectronic component, which is configured during operation to emit light in a range of a fourth spectral distribution in the visible range;
- a second conversion dye, which is arranged in the beam path of the second optoelectronic component and is configured to convert light in the fourth spectral distribution into light in a third spectral distribution in the infrared range;

wherein the control circuit is configured, during a fifth time period, to drive the second optoelectronic component in order to generate a second light pulse; and a signal generated by the optical sensor during a second time interval inside the fifth time period and during a sixth time period following the fifth time period, wherein the second time interval is selected so that it substantially lies inside a luminescence lifetime for the second conversion dye in the fifth time period.

19. The spectroscopy arrangement as claimed in claim 15, wherein the control circuit is configured to register a signal generated by the optical sensor during a fourth time period, the fourth time period lying after one of the second time period, third time period and sixth time period.

20. The spectroscopy arrangement as claimed in claim 19, wherein a start of the fourth time period depends on a relaxation time of the first and/or second conversion dye, and in particular is selected so that luminescence in the first and/or second conversion dye is substantially no longer taking place.

* * * * *